United States Patent
Charapale et al.

(10) Patent No.: US 11,943,893 B2
(45) Date of Patent: Mar. 26, 2024

(54) ELECTRONICS EQUIPMENT CABINETS FOR HOUSING ELECTRONIC DEVICES

(71) Applicant: Vertiv Corporation, Columbus, OH (US)

(72) Inventors: Utkarsh Diliprao Charapale, Pune (IN); Srinivasan Natarajan, Erode (IN); Adarsh Khandelwal, Pune (IN)

(73) Assignee: Vertiv Corporation, Columbus, OH (US)

( * ) Notice: Subject to any disclaimer, the term of this patent is extended or adjusted under 35 U.S.C. 154(b) by 597 days.

(21) Appl. No.: 17/080,169

(22) Filed: Oct. 26, 2020

(65) Prior Publication Data
US 2021/0127525 A1 Apr. 29, 2021

(30) Foreign Application Priority Data

Oct. 26, 2019 (IN) .............................. 201921043612

(51) Int. Cl.
*H05K 7/20* (2006.01)
(52) U.S. Cl.
CPC ..... *H05K 7/20145* (2013.01); *H05K 7/20127* (2013.01); *H05K 7/20909* (2013.01)
(58) Field of Classification Search
None
See application file for complete search history.

(56) References Cited

U.S. PATENT DOCUMENTS

| 10,856,448 | B1* | 12/2020 | Wiley | H05K 7/20145 |
| 2003/0107873 | A1 | 6/2003 | Van Gaal | |
| 2008/0068798 | A1 | 3/2008 | Hendrix et al. | |
| 2009/0311463 | A1 | 12/2009 | Wayman et al. | |
| 2013/0120934 | A1* | 5/2013 | Barna | H05K 7/20918 361/689 |
| 2013/0170140 | A1* | 7/2013 | Dunn | H05K 7/20145 313/46 |
| 2015/0237761 | A1* | 8/2015 | Dunn | H05K 7/20972 362/97.3 |

\* cited by examiner

*Primary Examiner* — Richard H Kim
(74) *Attorney, Agent, or Firm* — Harness, Dickey & Pierce, P.L.C.

(57) ABSTRACT

An electronics equipment cabinet includes multiple cabinet walls defining an interior enclosure space for housing at least one electronic device, an outer wall positioned to shield from solar radiation an outer surface of at least one of the multiple cabinet walls, and at least one divider wall positioned between the outer wall and the cabinet wall to define first and second channels. The cabinet wall has two openings to allow internal cabinet air to flow between the interior enclosure space and the first channel, while inhibiting external ambient air from entering the interior enclosure space and the first channel. The outer wall has two openings positioned to allow external ambient air to flow through the second channel to cool the internal cabinet air in the first channel via heat exchange through the divider wall, while inhibiting the external cabinet air from mixing with the internal cabinet air.

14 Claims, 13 Drawing Sheets

ELECTRONICS EQUIPMENT CABINETS FOR HOUSING ELECTRONIC DEVICES

CROSS-REFERENCE TO RELATED APPLICATION

This application claims the benefit and priority of Indian Application No. 201921043612 filed Oct. 26, 2019. The entire disclosure of the above application is incorporated herein by reference.

FIELD

The present disclosure relates to electronic equipment cabinets for housing electronic devices.

BACKGROUND

This section provides background information related to the present disclosure which is not necessarily prior art.

Electronic equipment cabinets often house electronic devices such as rectifiers, etc. During operation, the rectifiers generate heat and increase the temperature in the cabinet. Some electronic equipment cabinets are sealed to inhibit entry of debris, etc. from external ambient air, which could otherwise damage or impair operation of the rectifiers inside the cabinets.

The increased temperatures inside the cabinet during operation of the rectifiers may reduce performance of the rectifiers, may damage the rectifiers, etc. Some cabinets include a solar shield adjacent one or more walls of the cabinet to reduce the solar heating load on the cabinet.

SUMMARY

This section provides a general summary of the disclosure, and is not a comprehensive disclosure of its full scope or all of its features.

According to one aspect of the present disclosure, an electronics equipment cabinet generally includes multiple cabinet walls defining an interior enclosure space for housing at least one electronic device, an outer wall positioned to shield from solar radiation at least a portion of an outer surface of at least one of the multiple cabinet walls defining the interior enclosure space, and at least one divider wall positioned between the outer wall and said at least one of the multiple cabinet walls defining the interior enclosure space. The divider wall defines a first channel along a first side of the divider wall and a second channel along a second side of the divider wall. The at least one of the multiple cabinet walls defining the interior enclosure space has at least two internal openings to allow internal cabinet air to flow between the interior enclosure space and the first channel, while inhibiting external ambient air from entering the interior enclosure space and the first channel. The outer wall has at least two external openings positioned to allow external ambient air to flow through the second channel to cool the internal cabinet air in the first channel via heat exchange through the divider wall, while inhibiting the external cabinet air from mixing with the internal cabinet air.

According to another aspect of the present disclosure, an electronics equipment cabinet for housing one or more electronic devices includes multiple cabinet walls defining an interior enclosure space for housing at least one electronic device, and an outer wall positioned to shield from solar radiation at least a portion of an outer surface of at least one of the multiple cabinet walls defining the interior enclosure space, to define a channel between the outer wall and said at least one of the multiple cabinet walls defining the interior enclosure space. The outer wall has at least two openings extending therethrough to allow external ambient air to flow through the channel. The cabinet also includes one or more inclined plates positioned within the channel. Each inclined plate includes a first end and a second end, and each inclined plate is oriented at a non-parallel angle with respect to the outer wall to increase an airflow velocity of the external ambient air traveling through the channel via the at least two openings.

According to yet another aspect of the present disclosure, an electronics equipment cabinet for housing one or more electronic devices includes multiple cabinet walls defining an interior enclosure space. The multiple walls are coupled to one another to seal the interior enclosure space to inhibit external ambient air from entering the interior enclosure space. The cabinet also includes multiple electronic devices positioned within the interior enclosure space. The multiple electronic devices each include a fan to selectively drive air through the electronic device and at least partially circulate air within the interior enclosure space. The cabinet also includes an outer wall positioned between the outer wall and said at least one of the multiple cabinet walls defining the interior enclosure space, to define a channel between the outer wall and said at least one of the multiple cabinet defining the interior enclosure space. The outer wall has at least two openings positioned to allow airflow through the channel. The cabinet further includes a fan positioned to selectively drive external ambient air into the channel via a first one of the at least two openings, and out of the channel via a second one of the at least two openings.

Further aspects and areas of applicability will become apparent from the description provided herein. It should be understood that various aspects and features of this disclosure may be implemented individually or in combination with one or more other aspects or features. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding features throughout the several views of the drawings.

DETAILED DESCRIPTION

Figure 1:
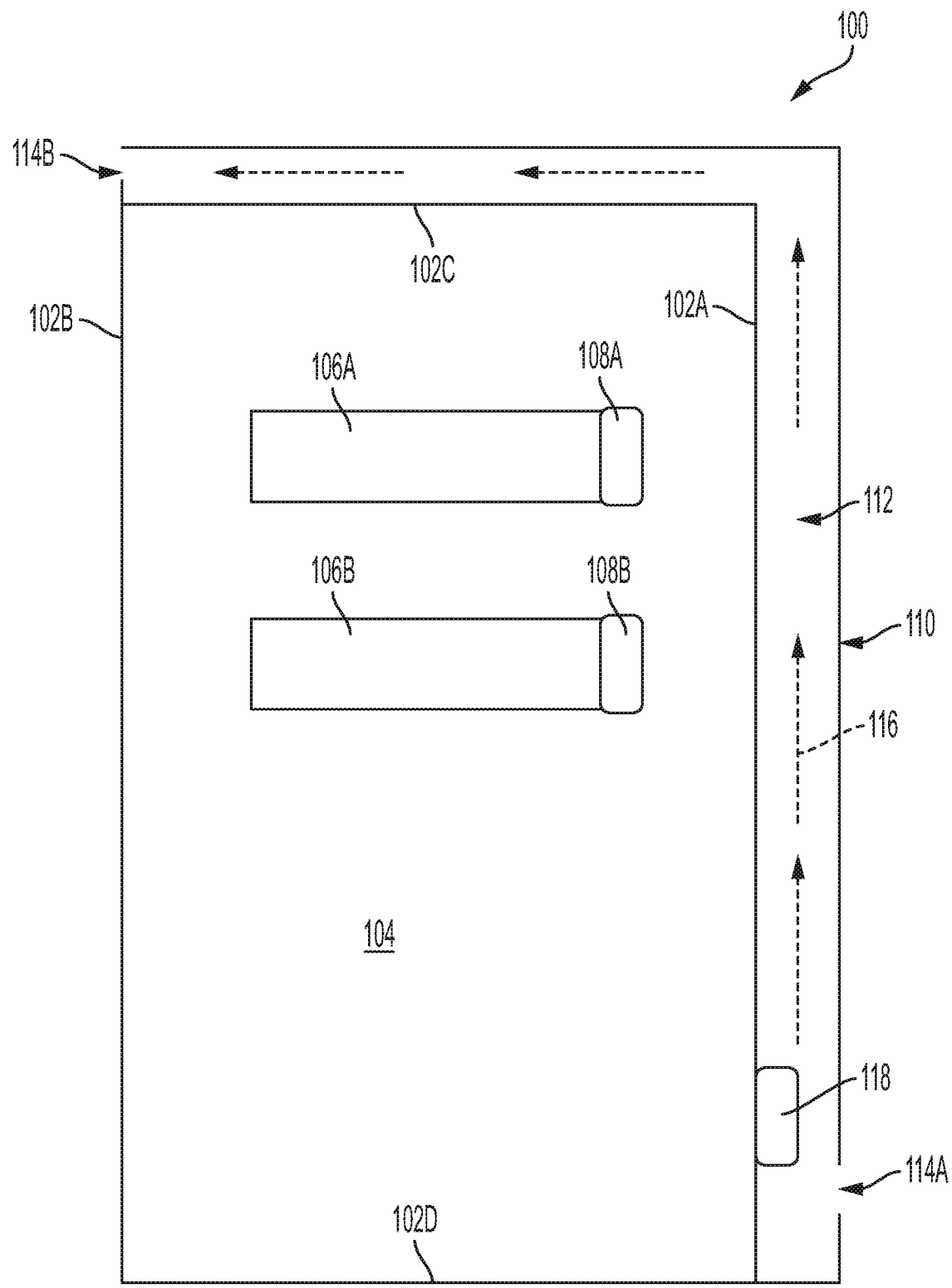
FIG. 1 is a sectional view of an electronics equipment cabinet according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

An electronics equipment cabinet according to one example embodiment of the present disclosure is illustrated in FIG. 1 and indicated generally by reference number 100. The cabinet 100 includes multiple cabinet walls 102A-102D defining an interior enclosure space 104. The multiple walls 102A-102D are coupled to one another to seal the interior enclosure space 104 to inhibit external ambient air from entering the interior enclosure space 104.

The cabinet 100 also includes multiple electronic devices 106A and 106B positioned within the interior enclosure space 104. The electronic devices 106A and 106B each include corresponding fan 108A or 108B to selectively drive air through the electronic device 106A or 106B and at least partially circulate air within the interior enclosure space 104.

As shown in FIG. 1, the cabinet 100 further includes an outer wall 110 positioned to shield solar radiation from the outer surface (e.g., an exterior side, etc.) of the cabinet wall 102A, and an outer surface of the cabinet wall 102C. The outer wall 110 defines a channel 112 between the outer wall 110 and the cabinet wall 102A, and between the outer wall 110 and the cabinet wall 102C.

The outer wall 110 has two openings 114A and 114B extending therethrough, which are positioned to allow airflow 116 through the channel 112. The cabinet additionally includes a fan 118 positioned to selectively drive external ambient air into the channel 112 via the opening 114A, and out of the channel 112 via the opening 114B.

Although FIG. 1 illustrates the outer wall 110 as adjacent the top cabinet wall 102C and the side cabinet wall 102A, in other embodiments the outer wall 110 may be adjacent to one or more other cabinet walls (e.g., a side wall, a front wall, a back wall, etc.), may shield only a portion of a cabinet wall, may not cover the top cabinet wall 102C, etc. For example, the outer wall 110 may be a solar shield coupled to one or more cabinet walls 102A-102D. Thus, a solar shield may define a small enclosure on a top, a side, a bottom, etc. of the cabinet 100. In some embodiments, the outer wall 110 may be defined by inserting a partition into a region (e.g., an upper region etc.) of the interior space of the cabinet 100, to separate an outer wall from the interior space defined within (e.g., below, etc.) the inserted partition, etc. Thus, a partition may define a small enclosure within a top portion, a side portion, a bottom portion, etc. of the interior space of the cabinet 100.

The outer wall 110 may include any suitable wall (e.g., solar shield, etc.) that reflects, inhibits, etc. at least some solar energy from heating the corresponding cabinet walls 102A-D, to inhibit solar energy from raising the temperature of the interior enclosure space 104, or at least reduce the magnitude of the increased temperature in the interior enclosure space 104 due to the solar energy (e.g., as compared to a magnitude of the increased temperature due to the solar energy if the solar shied 110 were not present).

The outer wall 110 may be formed of a specific material or combination of materials for reflecting solar energy. For example, the outer wall 110 may be formed of aluminum (e.g., anodized aluminum, etc.), a fiberglass material, and/or another suitable material that has a desired reflection coefficient (e.g., a ratio of the radiation flux reflected by a surface to the incident radiation flux). In some embodiments, the outer wall 110 may include a material (e.g., a film, a paint, etc.) applied to the surface of the outer wall 110, such as a reflective film, a lightly colored (e.g., white) paint, etc.

As mentioned above, the cabinet 100 includes a fan 118 positioned to selectively drive external ambient air into the channel 112 via a first opening 114A, and out of the channel 112 via a second opening 114B. For example, the fan 118 may be located within the channel 112 (e.g., as shown in FIG. 1) to drive the airflow 116 through the channel 112, the fan 118 may be located outside of the channel 112 to direct airflow into or out of one of the openings 114A or 114B, more than one fan 118 may positioned within or outside of the channel 112, etc.

As described further below, in some embodiments the fan 118 may extend into the interior enclosure space 104 while being substantially sealed from the interior enclosure space 104 by a cover, etc. The fan 118 may then be open to the channel 112 on a side of the fan 118 opposite the cover/interior enclosure space 104, in order to selectively drive the airflow 116 through the channel 112.

The fan 118 may include any suitable air circulation device, such as an axial fan, an impeller fan, etc. In some embodiments, the fan 118 includes a one rack unit (1RU) fan (e.g., 20 mm×20 mm, etc.). The fan 118 may cause a reduction in temperature within the cabinet 100 by any suitable amount, such as a reduction of about six degrees Celsius at an intake of the electronic devices 106A and 1068, etc.

Although FIG. 1 illustrates two electronic devices 106A and 106B positioned in the interior enclosure space 104, other embodiments may include more or less electronic devices. For example, the interior enclosure space may house any suitable electronic devices, including power supply equipment (e.g., switched-mode power supplies, batteries, rectifiers, etc.), and electronic communication (e.g., telecommunications) equipment (e.g., radios, antennas, transmitters, computers, servers, etc.).

Figure 2:
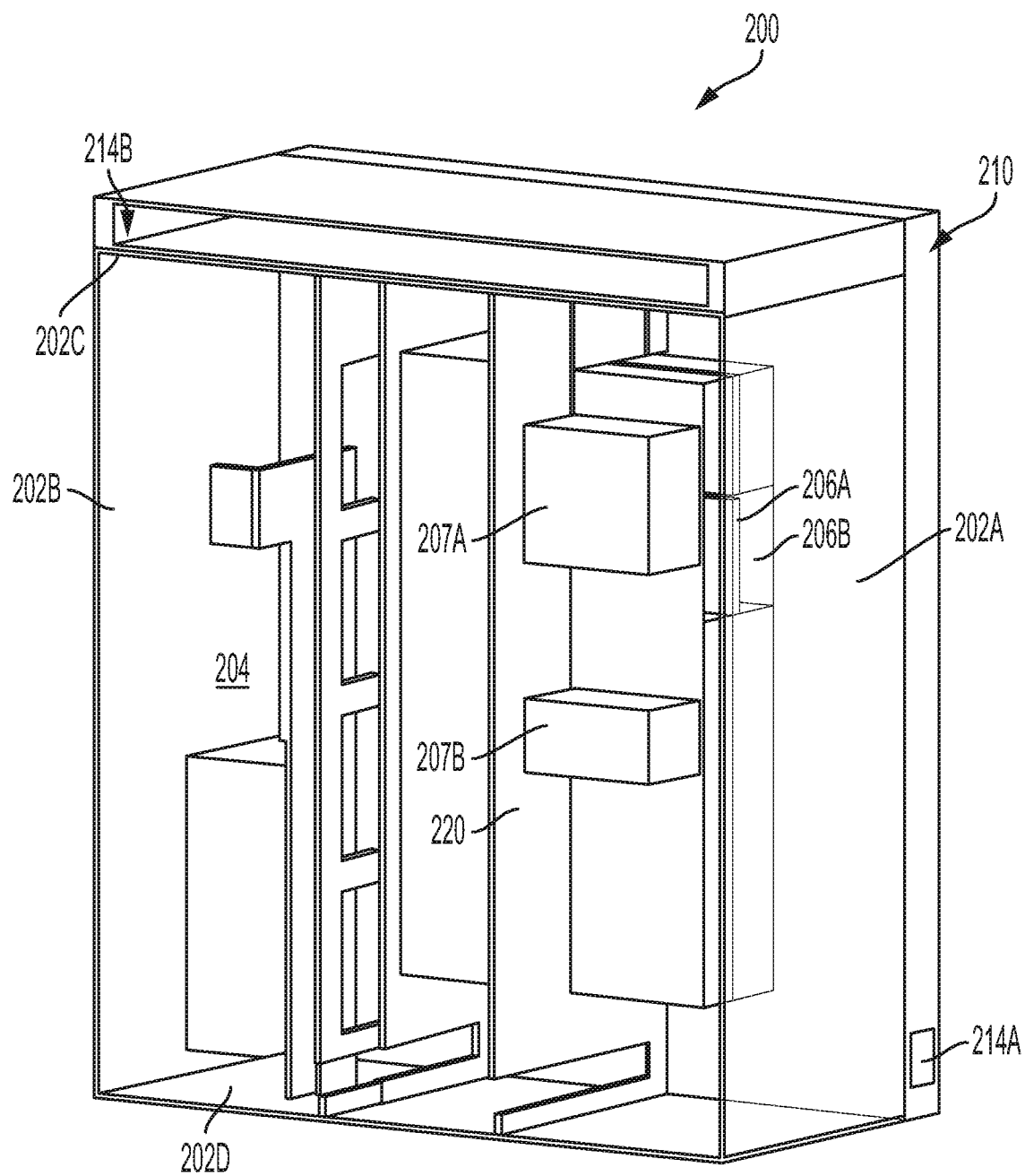
FIG. 2 is an orthogonal view of an electronics equipment cabinet with two cabinet walls removed, according to another example embodiment of the present disclosure.

FIG. 2 illustrates a view of an electronics equipment cabinet 200 according to another example embodiment, with some cabinet walls removed to show interior components. The example cabinet 200 may be similar to the cabinet 100 illustrated in FIG. 1. As shown in FIG. 2, the cabinet 200 includes multiple cabinet walls 202A-202D defining an interior enclosure space 204. The front and right-side cabinet walls are not illustrated in FIG. 2 to allow illustration of interior cabinet components.

The multiple walls 202A-202D are coupled to one another to seal the interior enclosure space 204 to inhibit external ambient air from entering the interior enclosure space 204. For example, each cabinet wall 202A-202D may be coupled to adjacent walls via an airtight connection, each joint may include a sealing gasket, caulk or another suitable sealing medium, etc.

The cabinet 200 also includes multiple electronic devices 206A, 206B, 207A and 207B positioned within the interior enclosure space 204. The electronic devices 206A, 206B, 207A and 207B may positioned in any suitable location, such as on one or more equipment racks 220, etc.

The electronic devices 206A and 206B each include a corresponding fan to selectively drive air through the electronic device 206A or 206B and at least partially circulate air within the interior enclosure space 204. For example, the fan may be positioned at an air entry of the electronic device, an air exit of the electronic device, etc., to direct air through the electronic device.

As shown in FIG. 2, the cabinet 200 further includes an outer wall 210 positioned to shield solar radiation from an exterior side of the cabinet wall 202A, and from an exterior side of the cabinet wall 202C. The outer wall 210 defines a channel between the outer wall 210 and the cabinet wall 202A, and between the outer wall 210 and the cabinet wall 202C.

The outer wall 210 has two openings 214A and 214B extending therethrough, which are positioned to allow airflow through the channel 214. The cabinet additionally may include a fan positioned to selectively drive external ambient air into the channel via the opening 214A, and out of the channel via the opening 214B.

Figure 3:
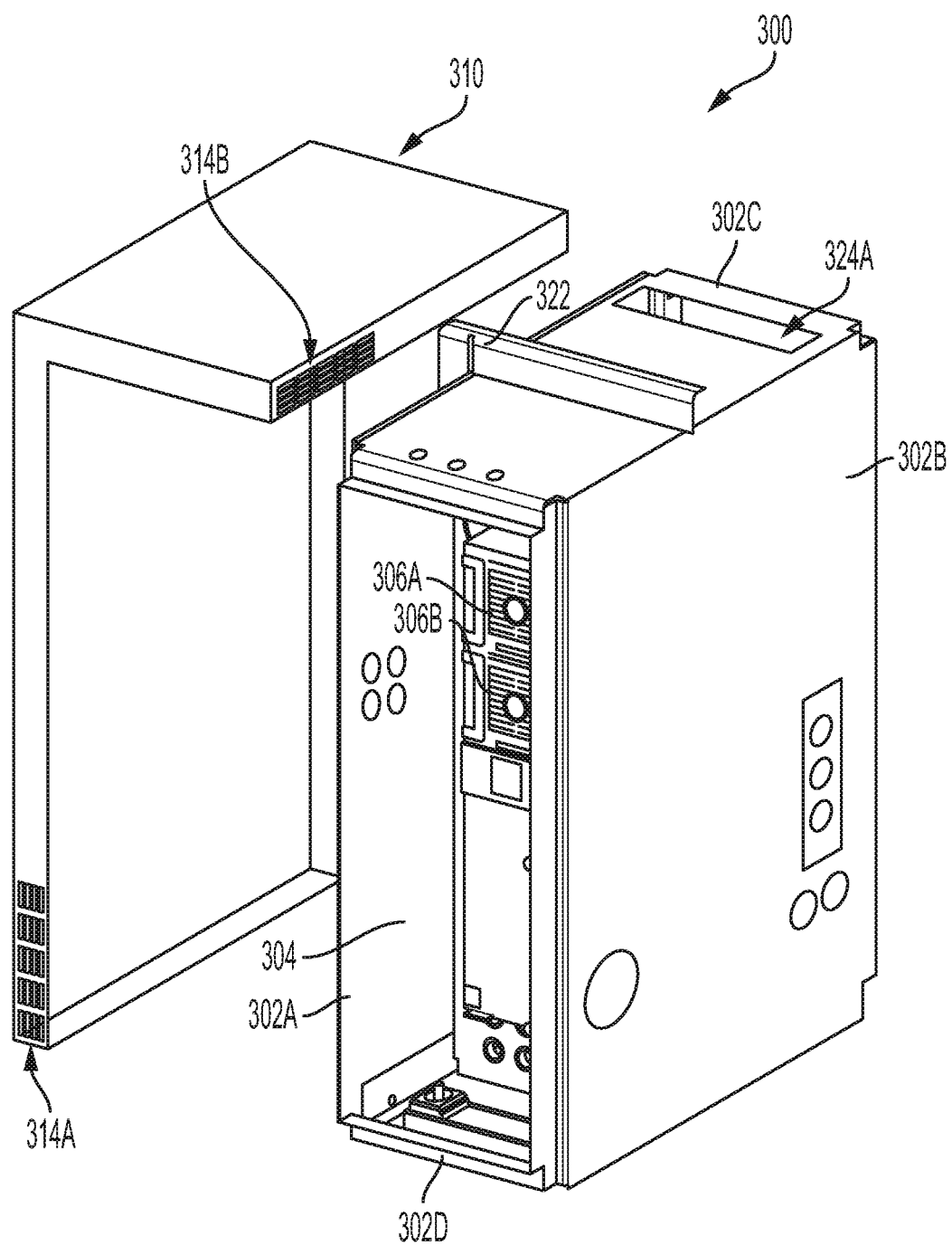
FIG. 3 is an exploded orthogonal view of an electronics equipment cabinet including a divider wall, according to yet another example embodiment of the present disclosure.
Figure 4:
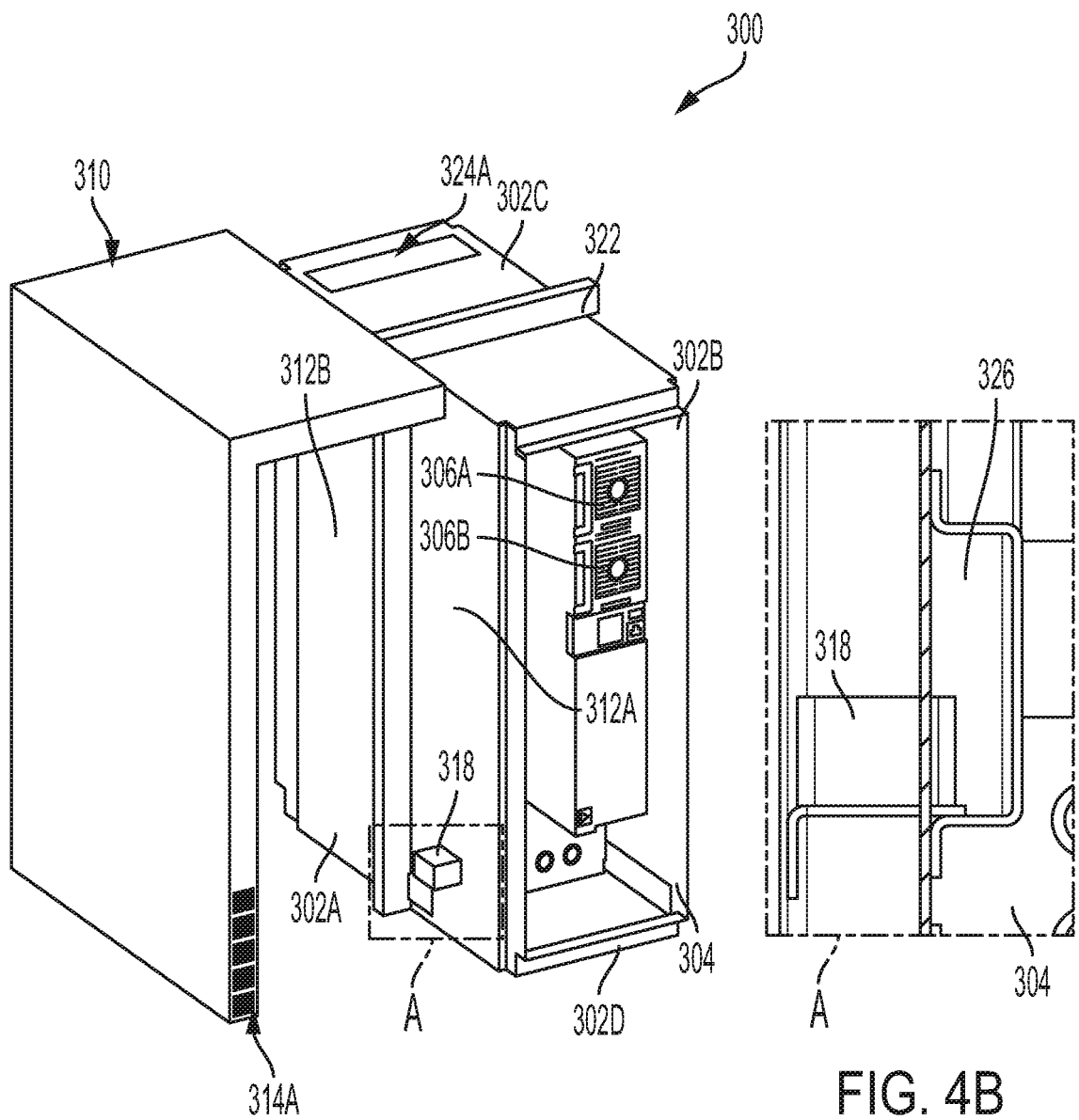
FIG. 4A is an exploded orthogonal view of the electronics equipment cabinet of FIG. 3, illustrating a fan in a channel of the outer wall.
FIG. 4B is a sectional view showing a housing for a fan illustrated in FIG. 4A.

FIGS. 3-6 illustrate an electronics equipment cabinet 300 according to another example embodiment of the present disclosure. As shown in FIG. 3, the cabinet 300 generally includes multiple cabinet walls 302A-302D defining an interior enclosure space 304 for housing electronic devices 306A and 306B, and an outer wall 310 coupled to an exterior side of the cabinet walls 302A and 302C.

Although FIG. 3 illustrates a single unitary outer wall covering both a side wall 302A and a top wall 302C, in other embodiments there may be multiple outer walls that are separate from one another, outer wall(s) that cover only a portion of one or more cabinet walls, etc. Also, in other embodiments the interior enclosure space 304 may house more or less than two electronic devices, which may include any suitable devices such as power devices (e.g., rectifiers), communication devices, etc.

Figure 5:
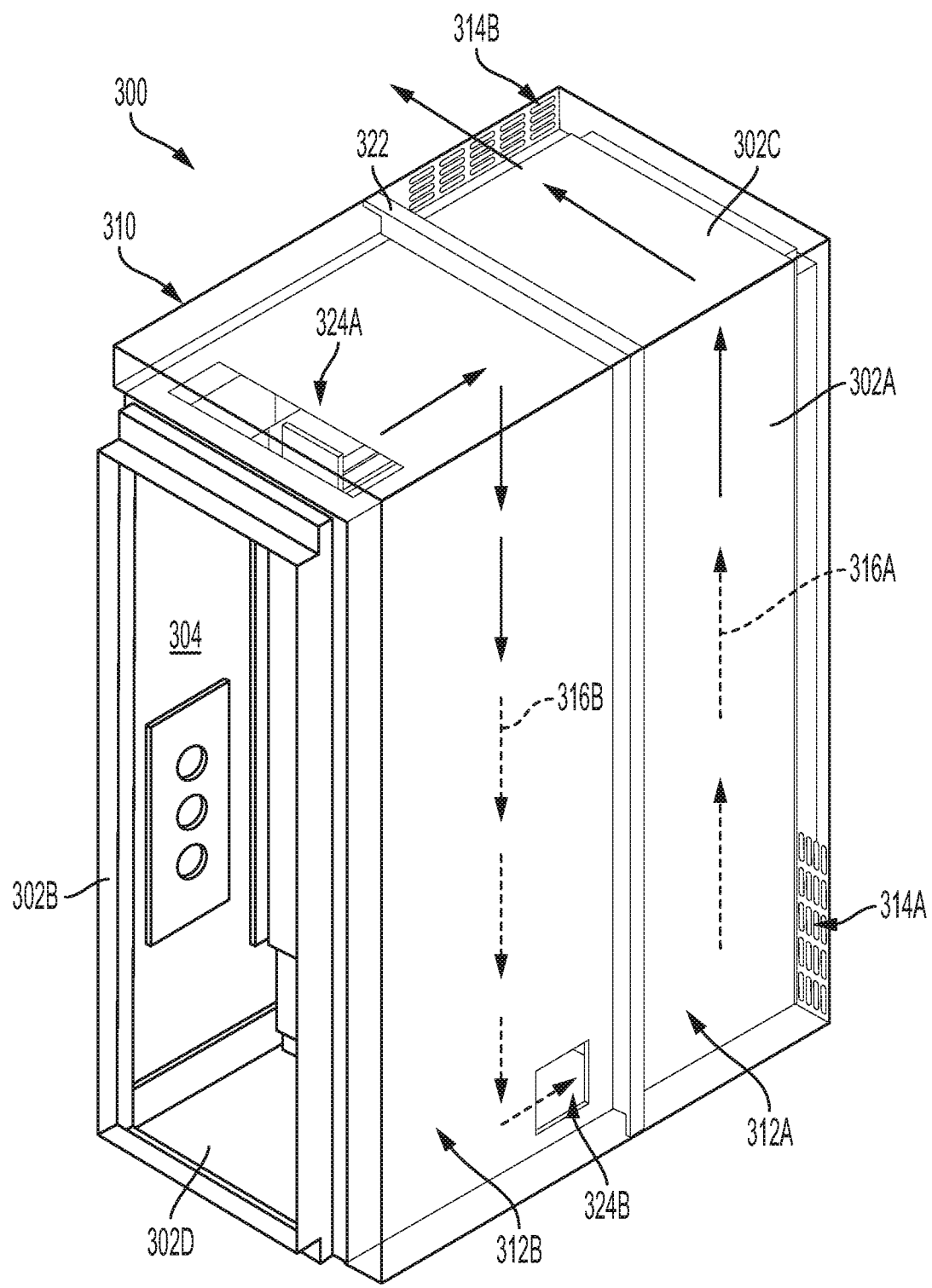
FIG. 5 is an orthogonal view of the electronics equipment cabinet of FIG. 3 with the outer wall removed to illustrate airflow in the channels of the outer wall.

The cabinet 300 includes a divider wall 322 (e.g., a divider plate, etc.) positioned between the outer wall 310 and the cabinet walls 302A and 302C shield by the outer wall 310. As shown in FIG. 5, the divider wall 322 defines a channel 312B along one side of the divider wall 322 and another channel 312A along another second side of the divider wall 322 (e.g., the channel 312A may be located along a side of the divider wall 322 that is opposite the wall along which channel 312B is located).

The cabinet wall 302A shielded by the outer wall 310 has two internal (e.g., cabinet wall, etc.) openings 324A and 324B to allow internal cabinet air to flow between the interior enclosure space 304 and the channel 312B, while inhibiting external ambient air from entering the interior enclosure space 304 and the channel 312B. For example, the interior enclosure space 304 and the first channel 312B may be sealed from the external ambient air, while still allowing the internal cabinet air to flow between the interior enclosure space and the first channel 312B to cool the internal cabinet air.

The outer wall 310 has two external (e.g., shield, etc.) openings 314A and 314B positioned to allow external ambient air to flow through the channel 312A to cool the internal cabinet air in the channel 312B via heat exchange through the divider wall 322, while inhibiting the external cabinet air from mixing with the internal cabinet air.

For example, internal cabinet air in the interior enclosure space 304 may be heated during operation of the electronic devices 306A and 306B, and the heated internal cabinet air may circulate through the channel 312B via an airflow 316B.

In the airflow 316B, the heated internal cabinet air may rise to the top of the interior enclosure space 304 to flow through the opening 324A on the top cabinet wall 302C, the heated internal cabinet air may be driven to the opening 324A via one or more fans (e.g., a fan associated with one of the electronic devices 306A and 306B, a fan positioned in the channel 312B, etc.).

As the internal heated cabinet air moves down the channel 312B towards the opening 324B in the side cabinet wall 302A, the air may be cooled via heat exchange through the divider wall 322. For example, external ambient air may be cooler than the heated internal cabinet air, and the external ambient air may move through the channel 312A on the opposite side of the divider wall 322 from the channel 312B.

As shown in FIG. 5, the external ambient air may enter the channel 312A via the opening 314A in the outer wall 310 (e.g., via natural outdoor air flow, via a fan located in the channel 312A, etc.). As the airflow 316A of the external ambient air rises in the channel 312A, the external ambient air may absorb heat from the heated internal cabinet airflow 316B via heat exchange through the divider wall 322. In some example embodiments herein, cooler portions of airflows may be represented by dashed arrows while hotter portions of airflows are represented by solid arrows.

Accordingly, the divider wall 322 may include a material having a high thermal conductivity (e.g., a metal, a plastic, etc.) to allow heat to transfer from the heated internal airflow 316B to the cooler external ambient airflow 316A, while inhibiting mixture of external ambient air and internal cabinet air (e.g., to prevent contamination of the internal cabinet air by debris from the external ambient air, etc.).

After the internal cabinet airflow 316B has transferred at least some heat through the divider wall 322, the now cooler internal cabinet airflow 316B reenters the interior enclosure space 304 via the opening 324B in the side cabinet wall 302A. Similarly, after the external ambient airflow 316A has absorbed at least some heat through the divider wall 322, the now warmer external ambient airflow 316A exits the outer wall 310 via the opening 314B in the outer wall 310. The divider wall 322 may generate a counterflow heat exchanger effect to reduce the temperature within the cabinet 300 by any suitable amount, such as about six degrees Celsius at an intake of the electronic devices 306A and 306B, etc.

Although FIG. 5 illustrates the opening 324A on the top cabinet wall 302C and the opening 324B on the side cabinet wall 302A, in other embodiments the openings in the cabinet walls may be located on different walls, on the same wall as one another, etc. Similarly, although FIG. 5 illustrates the opening 314A on a lower end of the outer wall 310 and the opening 314B on a top end of the outer wall 310, in other embodiments the openings in the outer wall may be located on other outer wall surfaces, on the same outer wall surface, etc.

As shown in FIGS. 3-6, the divider wall 322 is positioned perpendicular to the outer wall 310 and the cabinet walls 302A and 302C. In this manner, the divider wall 322 may be considered to divide the outer wall 310 into two adjacent portions, where the edge of the divider wall 322 that contacts the outer wall 310 defines an intersection of the two adjacent portions of the outer wall 310.

Similarly, the divider wall 322 may be considered to divide the side cabinet wall 302A into two adjacent portions, where another edge of the divider wall 322 that contacts the side cabinet wall 302A defines an intersection of the two adjacent portions of the side cabinet wall 302A.

In the above example arrangement, the channel 312A is located between the first portions of the outer wall 310 and the side cabinet wall 302A (e.g., along one side of the divider wall 322), and the channel 312B is located between second portions of the outer wall 310 and the side cabinet wall 302A.

FIGS. 3-6 illustrate the divider wall 322 as extending in a vertical direction from a bottom of the side cabinet wall 302A to a top of the side cabinet wall 302A. The height of the divider wall 322 in the vertical direction is greater than a height of the side cabinet wall 302A in the vertical direction.

This arrangement allows the divider wall 322 to exchange heat along the length of the airflows 316A and 316B, while inhibiting mixture of the internal cabinet air and external ambient air along the length of the airflows 316A and 316B. In other embodiments, the divider wall 322 may have a non-vertical orientation, may be shorter than a height of the side cabinet wall 302A, etc.

As shown in FIG. 4A, the electronics equipment cabinet 300 may include a fan 318 positioned to selectively drive the external ambient air through the channel 312A. FIG. 4B is a sectional view of the fan 318, taken at point A in FIG. 4A. As shown in FIG. 4B, the fan 318 may extend into the interior enclosure space 304 while being substantially sealed from the interior enclosure space 304 by a cover 326. The fan 318 may then be open to the channel 312A on a side of the fan 318 opposite the cover 326 and the interior enclosure space 304, in order to in order to selectively drive the airflow 316A through the channel 312A.

In other embodiments, the fan 318 may not extend into the interior enclosure space 304 and may not include a cover 326, the fan 318 may be positioned in other locations such as outside the outer wall 310 adjacent the opening 314A, etc. The fan 318 may include any suitable air circulation device, such as an axial fan, an impeller fan, etc.

As described above, the outer wall 310 may include one or more openings, such as openings 314A and 314B illustrated in FIGS. 3-6. Each opening may include a grate having multiple apertures, slots, etc. to define an open area percentage relative to an area of the opening 314A or 314B. For example, the grate may define about an eighty percent open area (e.g., the combined area of the apertures in the grate is about eighty percent of the total combined area of the apertures plus the row and column supports positioned between the apertures), the grate may define about a ninety percent open area, etc. The grate may be considered to have about, or substantially, an eighty percent, ninety percent, etc. open area, within manufacturing tolerances, within 1%, 5%, 10%, etc.

Figure 6:
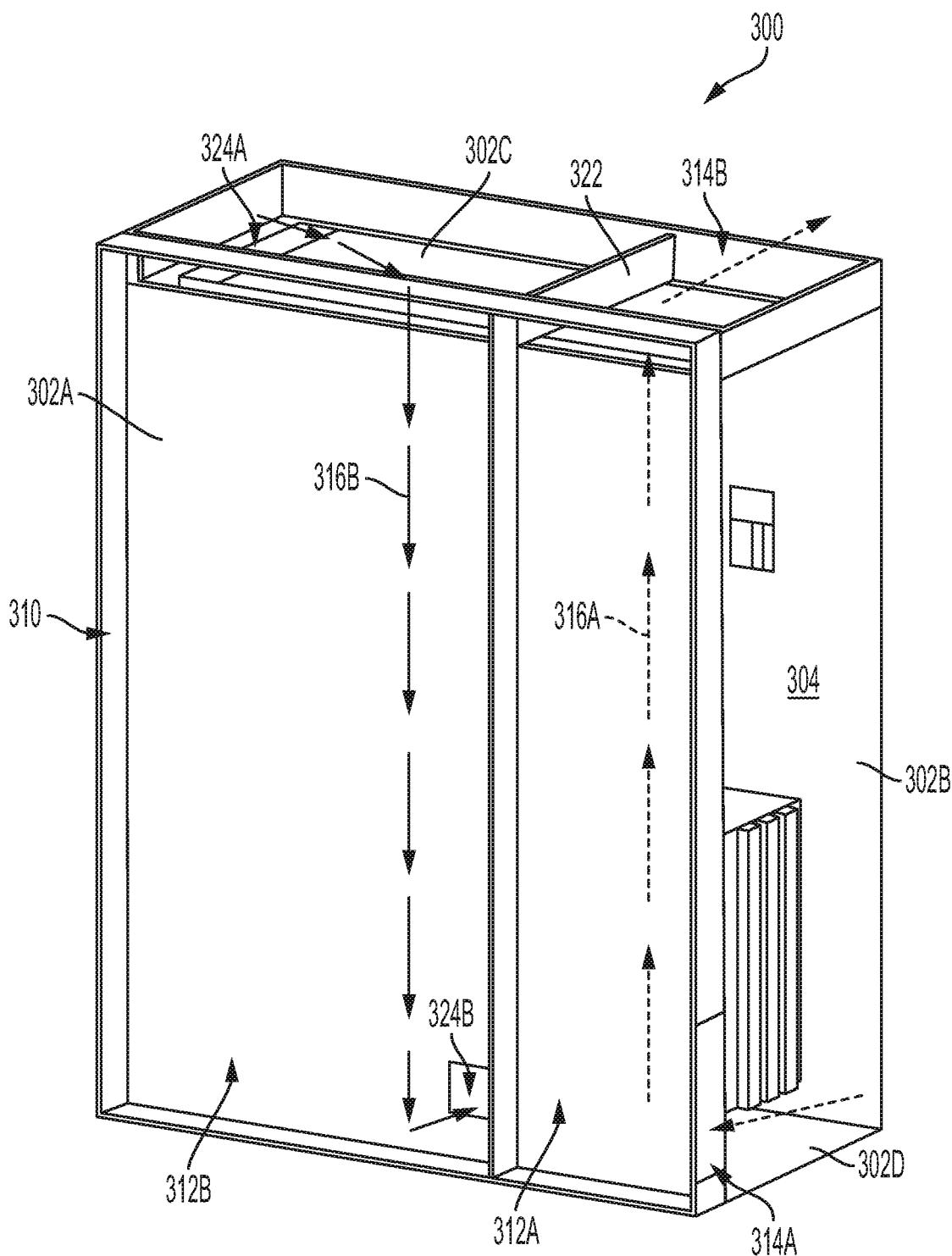
FIG. 6 is another orthogonal view of the electronics equipment cabinet of FIG. 3 with the outer wall removed to illustrate airflow in the channels of the outer wall.

FIG. 6 is another example diagram illustrating the internal cabinet airflow 316B and the external ambient airflow 316A through the respective channels 312B and 312A. As shown in FIG. 6, the heated internal cabinet air flows out of the interior enclosure space 304 via the opening 324A in the top cabinet wall 302C, down the channel 312B while transferring heat through the divider wall 322, and back into the interior enclosure space 304 via the opening 324B in the side cabinet wall 302A.

At the same time, the cooler external ambient air flows into the outer wall 310 via the opening 314A, up the channel 312A while absorbing heat through the divider wall 322, and back out of the outer wall 310 via the opening 314B.

Figure 7:
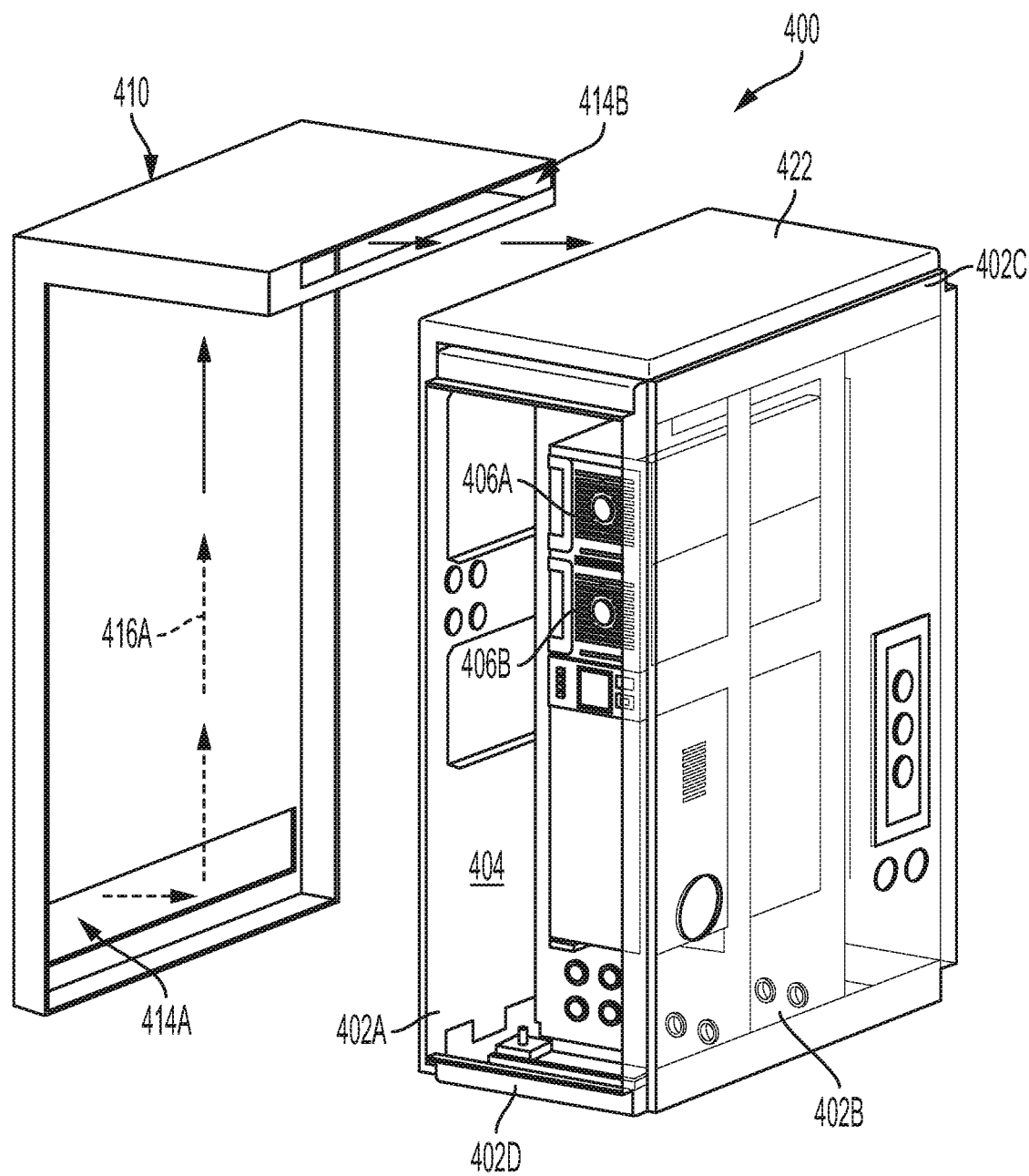
FIG. 7 is an exploded orthogonal view of an electronics equipment cabinet including a divider wall parallel to the outer wall, according to another example embodiment of the present disclosure.
Figure 8:
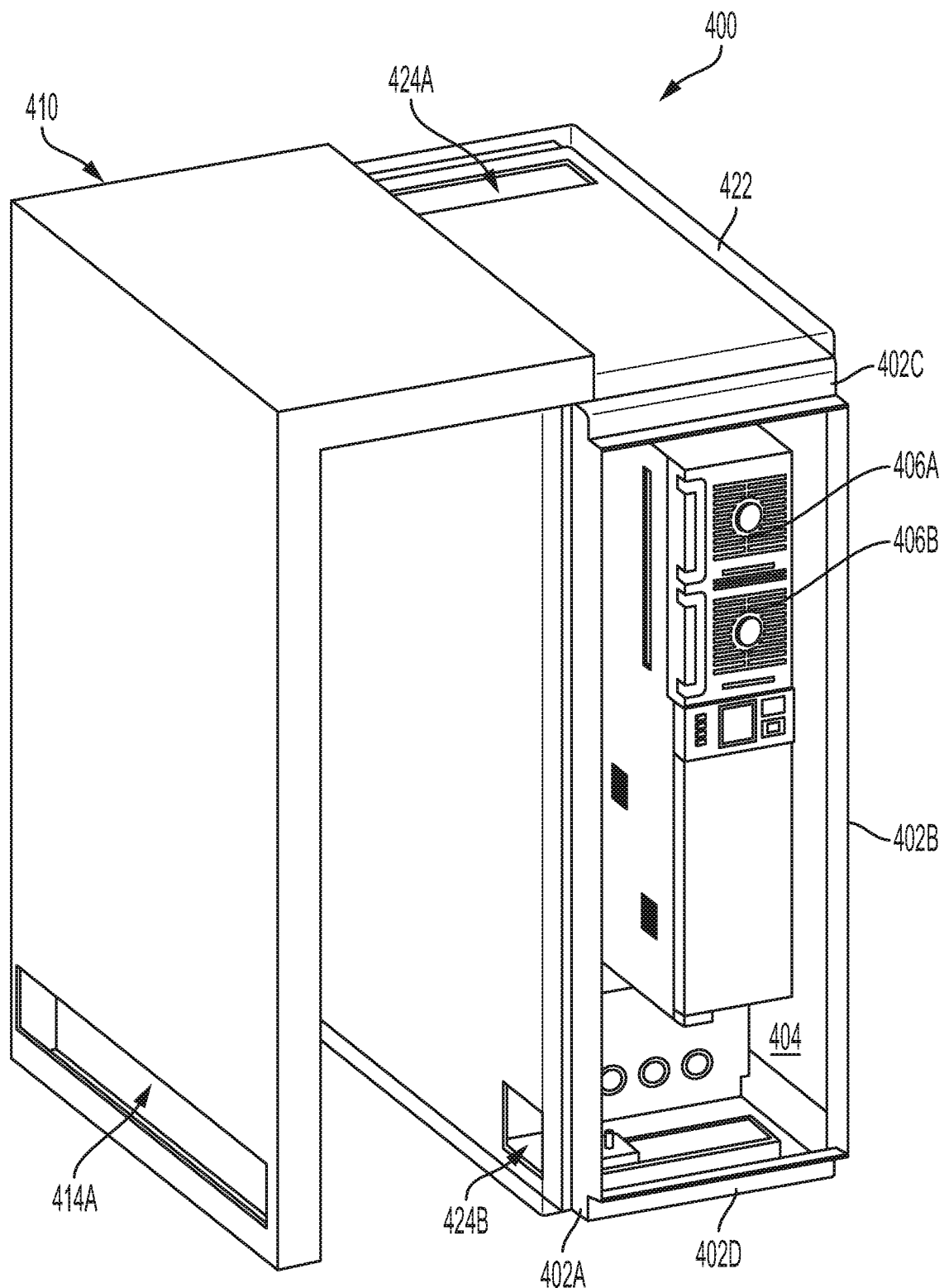
FIG. 8 is an exploded orthogonal view of the electronics equipment cabinet of FIG. 7, with the divider wall shown in wireframe for illustration of other cabinet features.

FIGS. 7-11 illustrate an electronics equipment cabinet 400 according to another example embodiment of the present disclosure. As shown in FIG. 7, the cabinet 400 generally includes multiple cabinet walls 402A-402D defining an interior enclosure space 404 for housing electronic devices 406A and 406B, and an outer wall 410 coupled to an exterior side of the cabinet walls 402A and 402C.

Although FIG. 7 illustrates a single unitary outer wall covering both a side wall 402A and a top wall 402C, in other embodiments there may be multiple outer wall that are separate from one another, outer wall (s) that cover only a portion of one or more cabinet walls, etc. Also, in other embodiments the interior enclosure space 404 may house more or less than two electronic devices, which may include any suitable devices such as power devices (e.g., rectifiers), communication devices, etc.

Figure 11:
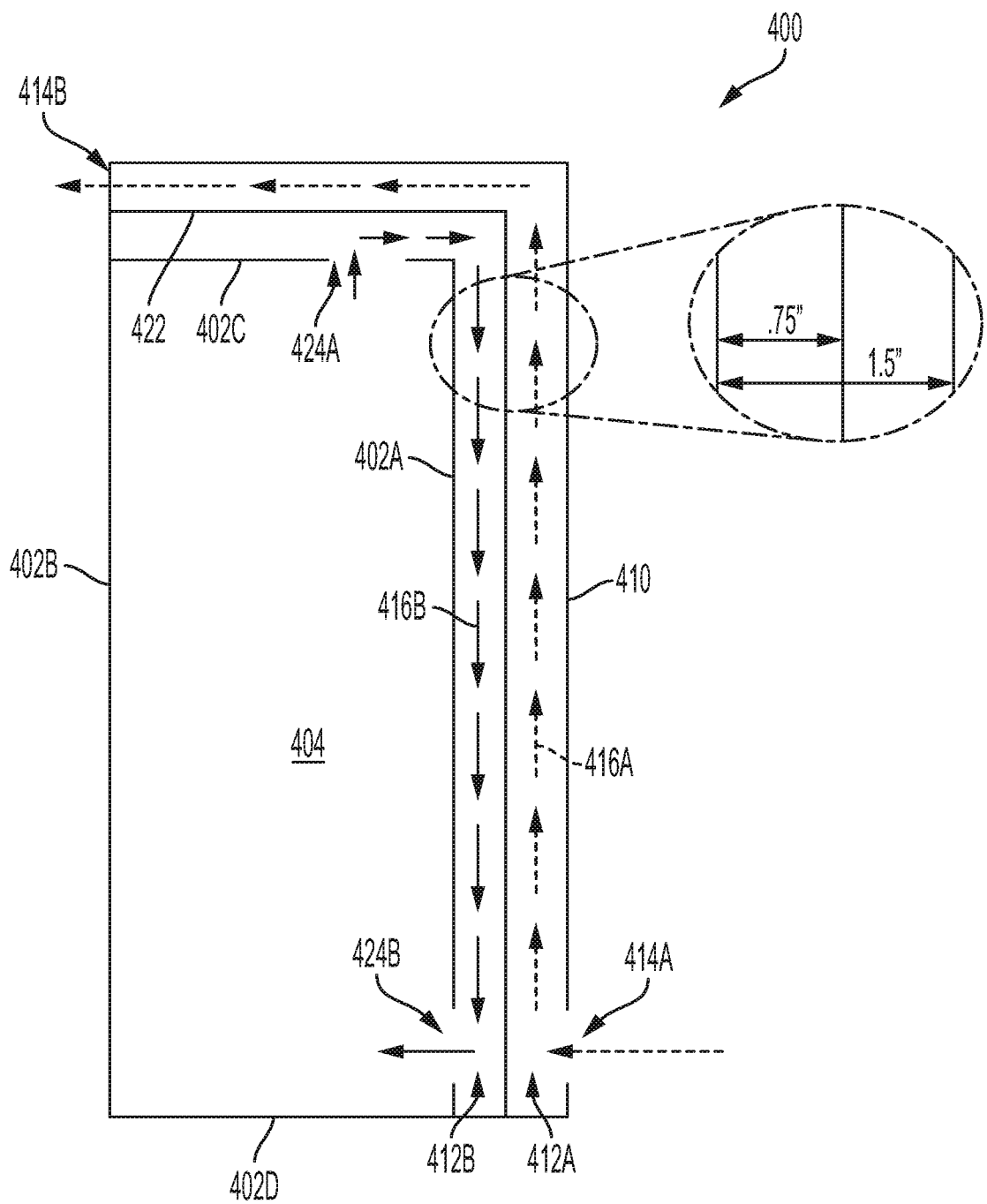
FIG. 11 is a sectional view of the electronics equipment cabinet of FIG. 7.

The cabinet 400 includes a divider wall 422 positioned between the outer wall 410 and the cabinet walls 402A and 402C shielded by the outer wall. As shown in FIG. 11, the divider wall 422 defines a channel 412B along one side of the divider wall 422 and another channel 412B along another second side of the divider wall 422 (e.g., the channel 412A may be located along a side of the divider wall 422 that is opposite the wall along which channel 412B is located).

The cabinet wall 402A shielded by the outer wall 410 has internal openings 424A and 424B to allow internal cabinet air to flow between the interior enclosure space 404 and the channel 412B, while inhibiting external ambient air from entering the interior enclosure space 404 and the channel 412B. For example, the interior enclosure space 404 and the first channel 412B may be sealed from the external ambient air, while still allowing the internal cabinet air to flow between the interior enclosure space and the first channel 412B to cool the internal cabinet air.

The outer wall 410 has two shield openings 414A and 414B positioned to allow external ambient air to flow through the channel 412A to cool the internal cabinet air in the channel 412B via heat exchange through the divider wall 422, while inhibiting the external cabinet air from mixing with the internal cabinet air.

For example, internal cabinet air in the interior enclosure space 404 may be heated during operation of the electronic devices 406A and 406B, and the heated internal cabinet air may circulate through the channel 412B via an airflow 416B.

In the airflow 416B, the heated internal cabinet air may rise to the top of the interior enclosure space 404 to flow through the opening 424A on the top cabinet wall 402C, the heated internal cabinet air may be driven to the opening 424A via one or more fans (e.g., a fan associated with one of the electronic devices 406A and 406B, a fan positioned in the channel 412B, etc.).

As the internal heated cabinet air moves down the channel 412B towards the opening 424B in the side cabinet wall 402A, the air may be cooled via heat exchange through the divider wall 422. For example, external ambient air may be cooler than the heated internal cabinet air, and the external ambient air may move through the channel 412A on the opposite side of the divider wall 422 from the channel 412B. The divider wall 422 may generate a counterflow heat exchanger effect to reduce the temperature within the cabinet 400 by any suitable amount, such as about seven degrees Celsius at an intake of the electronic devices 406A and 406B, etc.

As illustrated in FIGS. 7-11, the divider wall 422 is positioned parallel to the outer wall 410, the side cabinet wall 402A and the top cabinet wall 402C (e.g., in contrast to the divider wall 322 positioned perpendicular to the outer wall 310, the side cabinet wall 402A and the top cabinet wall 402C in FIGS. 3-6). The divider wall 422 may be considered as extending horizontally from the left side of the cabinet wall 402A to the right side of the cabinet wall 402A.

Due to the parallel orientation of the divider wall 422, the outer wall 410 may be considered as overlapping or covering the divider wall 422, while the divider wall 422 overlaps or covers the side cabinet wall 402A. Accordingly, the external ambient air channel 412A between the outer wall 410 and the divider wall 422 overlaps or covers the internal cabinet air channel 412B between the divider wall 422 and the side cabinet wall 402A.

The above arrangement increases the surface area of the divider wall 422 between the external ambient air channel 412A and the internal cabinet air channel 412B (e.g., as compared to the divider wall 322 of FIGS. 3-6), which may facilitate a greater amount of heat transfer between the channels (e.g., as compared to the divider wall 322 of FIGS. 3-6).

Figures 9A, 9B:
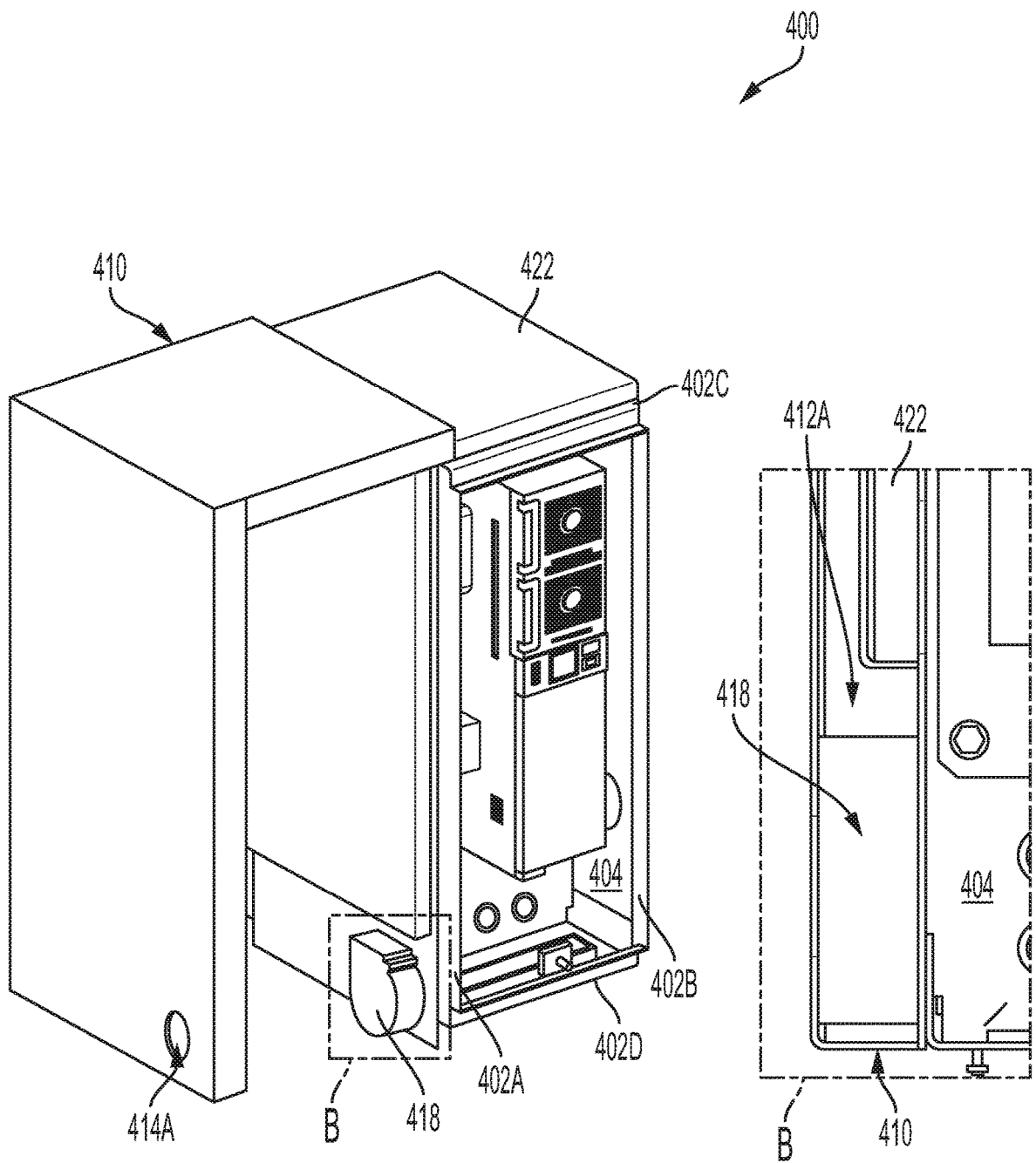
FIG. 9A is an exploded orthogonal view of the electronics equipment cabinet of FIG. 7, illustrating an air moving device in a channel of the outer wall.
FIG. 9B is a sectional view showing a housing for a fan illustrated in FIG. 9A.
Figure 10:
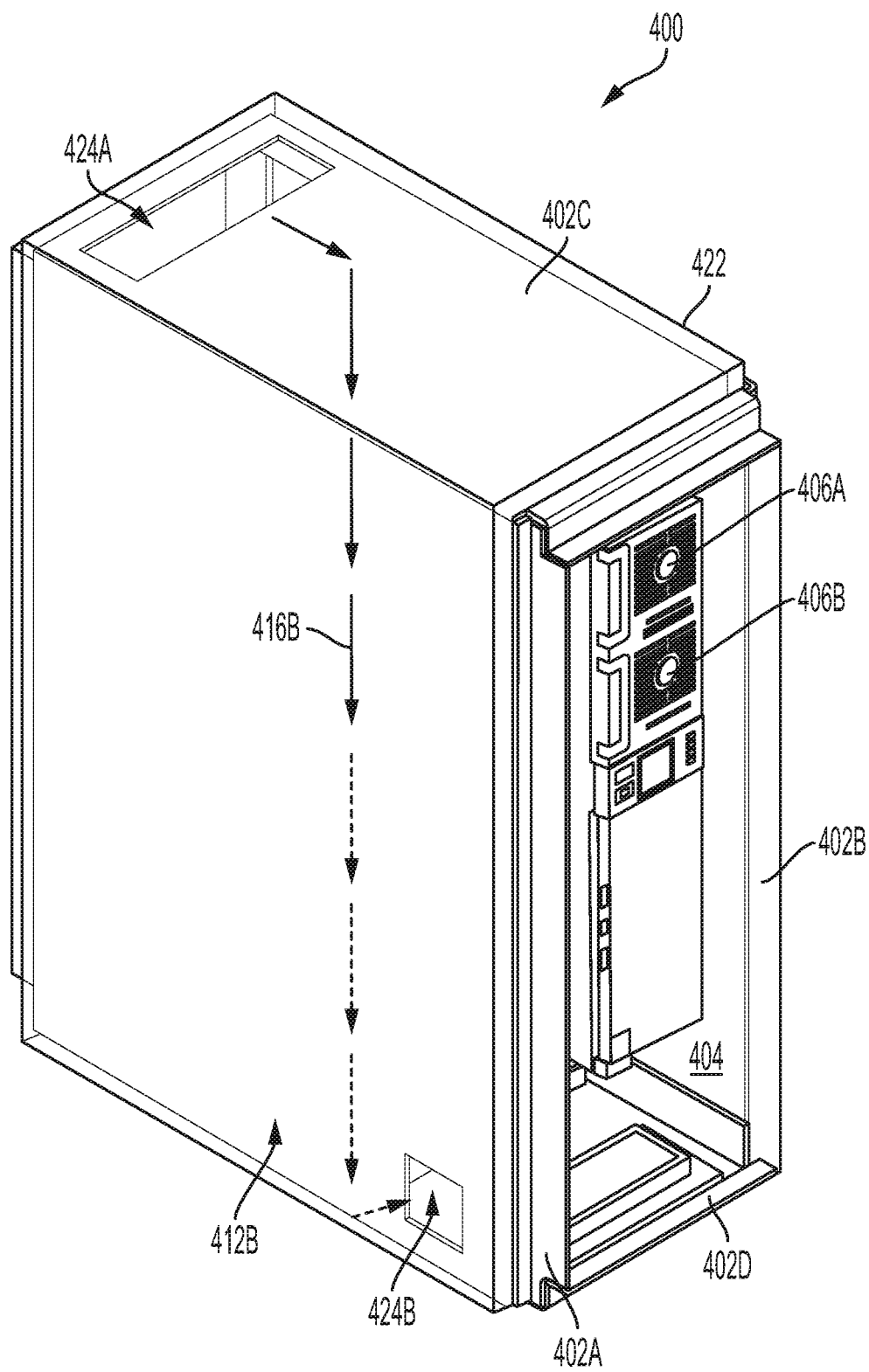
FIG. 10 is an orthogonal view of the electronics equipment cabinet of FIG. 7 with the outer wall removed and the divider wall made transparent to illustrate airflow in the channels of the outer wall.

As shown in FIG. 9A, the electronics equipment cabinet 400 may include a fan 418 positioned to selectively drive the external ambient air through the channel 412A. FIG. 9B is a sectional view of the fan 418, taken at point B in FIG. 9A. As shown in FIG. 9B, the fan 418 is positioned within the channel 412A between the outer wall 410 and the divider wall 422. The fan 418 may selectively drive the airflow 416A through the channel 412A.

In other embodiments, the fan 418 may extend into the interior enclosure space 404 and may include a cover (e.g., to seal the fan 418 from the interior enclosure space), the fan 418 may be positioned in other locations such as outside the outer wall 410 adjacent the opening 414A, etc. The fan 418 may include any suitable air circulation device, such as an axial fan, an impeller fan, etc.

FIG. 11 includes example dimensions of the channels 412A and 412B for purposes of illustration only. In other embodiments, the channels 412A and 412B may have larger or smaller dimensions, dimensions that are different from one another, etc.

Figure 12A:
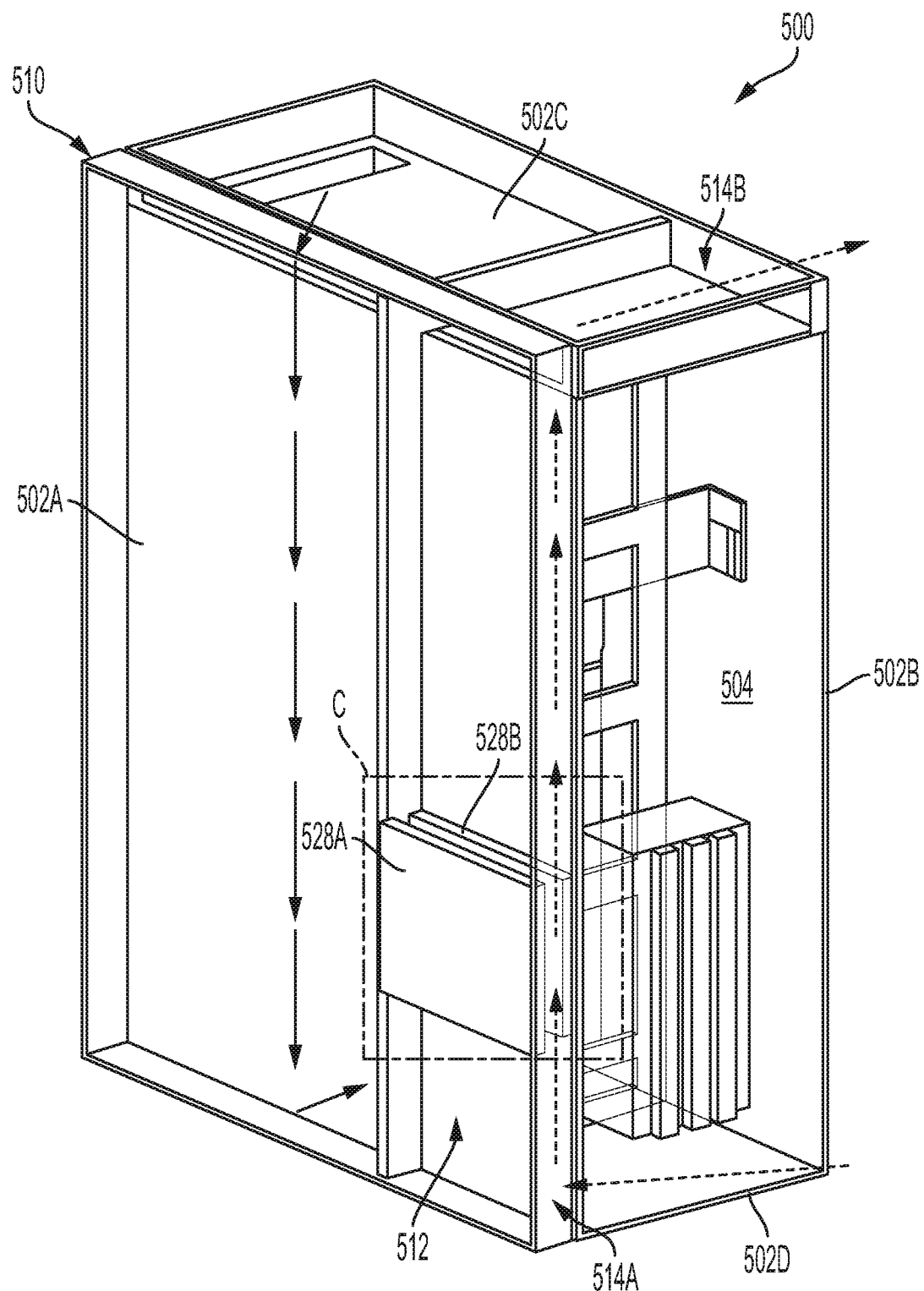
FIG. 12A is an orthogonal view of an electronics equipment cabinet including inclined plates in a channel, according to yet another example embodiment of the present disclosure.
Figure 12B:
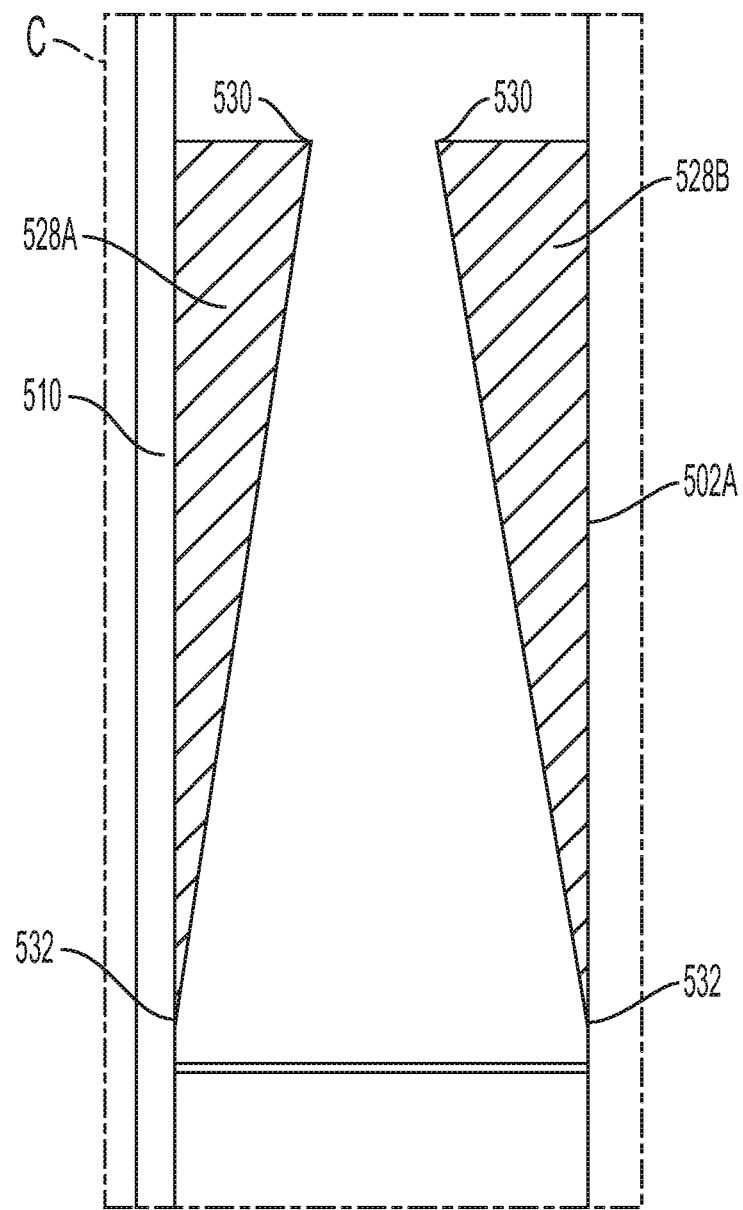
FIG. 12B is a sectional view of the inclined plates of FIG. 12A

FIGS. 12A and 12B illustrate an electronics equipment cabinet 500 for housing one or more electronic devices, according to another example embodiment of the present disclosure. The cabinet 500 includes multiple cabinet walls 502A-502D defining an interior enclosure space 504 for housing electronic device(s), and an outer wall 510 positioned to shield from radiation the cabinet walls 502A and 502C, to define a channel 512 between the outer wall and the cabinet walls 502A and 502C. The outer wall 510 includes two openings 514A and 514B extending therethrough to allow external ambient air to flow through the channel 512.

The cabinet 500 also includes two inclined plates 528A and 528B positioned within the channel 512. FIG. 12B is a sectional view of the inclined plates 528A and 528B taken at point C in FIG. 12A. As shown in FIG. 12B, each inclined plate 528A and 528B includes a first end 530 and a second end 532.

Each inclined plate 528A and 528B is oriented at a non-parallel angle with respect to the outer wall 510 to increase an airflow velocity of the external ambient air traveling through the channel 512 via the two openings 514A and 514B. For example, the inclined plate 528A is positioned on the outer wall 510 and angled outwards from outer wall 510 towards the first end 530 of the inclined plate 528A. Similarly, the inclined plate 528B is positioned on the side cabinet wall 502A and angled outward from the side cabinet wall 502A towards the first end 530 of the inclined plate 528B.

The inclined plates 528A and 528B may be tilted at any suitable angle with respect to the outer wall 510, with respect to the cabinet wall 502A, etc. For example, the inclined plates 528A and 528B may be tilted at an angle of about five degrees, about ten degrees, about fifteen degrees, about twenty degrees, etc. The angles may be considered as about, or substantially, a specified degree if the angle is within a manufacturing tolerance of the specified degree, within 1%, within 5%, within 10%, etc.

As shown in FIG. 12B, a distance between the first ends 530 of the included plates 528A and 528B may be smaller than a distance between the second ends 532 of the inclined plates 528A and 528B. The air may flow through the included plates in a direction from the second ends 532 towards the first ends 530, and the angles of the inclined plates 528A and 528B may increase a velocity of the air as it flows between the plates (e.g., due to the decreasing distance between the plates, etc.).

Although FIG. 12A illustrates only two inclined plates 528A and 528B, other embodiments may include more or less inclined plates, inclined plates positioned in other locations in the cabinets 100, 200, 300, 400, 500, etc. For example, the inclined plates 528A and 528B may be located in the channel 312A and/or the channel 312B of the cabinet 300, the channel 412A and/or 412B of the cabinet 400, etc. The inclined plates 528A and 528B may be used in other embodiments described herein.

Optionally, the fans 118, 218, 318 and 418 may be used in the channel 512 to further increase air velocity through the inclined plates 528A and 528B, or the inclined plates 528A and 528B may be used without a fan in the channel 512. In some embodiments, the inclined plates 528A and 528B may increase the velocity of air flow to an amount sufficient to reduce a temperature within the cabinet 500 by any suitable amount, such as about two degrees Celsius at an intake of electronic devices in the interior enclosure space 504, etc.

Example embodiments and aspects of the present disclosure may reduce temperatures in the cabinet relative to embodiments that do not include divider walls, outer wall channel fans, inclined plates, etc. Table 1 below lists example temperature reduction values for different combinations of features described herein. These values are for purposes of illustration only.

described. The same may also be varied in many ways. Such variations are not to be regarded as a departure from the disclosure, and all such modifications are intended to be included within the scope of the disclosure.

The invention claimed is:

1. An electronics equipment cabinet for housing one or more electronic devices, the cabinet comprising:
   multiple cabinet walls defining an interior enclosure space for housing at least one electronic device;
   an outer wall positioned to shield from solar radiation at least a portion of an outer surface of at least one of the multiple cabinet walls defining the interior enclosure space; and
   at least one divider wall positioned between the outer wall and said at least one of the multiple cabinet walls defining the interior enclosure space, the divider wall defining a first channel along a first side of the divider wall and a second channel along a second side of the divider wall;
   said at least one of the multiple cabinet walls defining the interior enclosure space having at least two internal openings to allow internal cabinet air to flow between the interior enclosure space and the first channel while inhibiting external ambient air from entering the interior enclosure space and the first channel; and
   the outer wall having at least two external openings positioned to allow external ambient air to flow through the second channel to cool the internal cabinet air in the first channel via heat exchange through the divider wall while inhibiting the external cabinet air from mixing with the internal cabinet air.

2. The electronics equipment cabinet of claim 1, wherein the divider wall is perpendicular to the outer wall and said at least one of the multiple cabinet walls defining the interior enclosure space.

3. The electronics equipment cabinet of claim 1, wherein:
   the first channel is positioned between a first portion of the outer wall and a first portion of said at least one of the multiple cabinet walls defining the interior enclosure space; and

TABLE 1

| Comp. | Outer Wall Only | Fan in Outer Wall Channel | Perp. Divider Wall - No Fan | With Fan | Parallel Divider Wall - No Fan | With Fan | Inclined Plates - No Fan | Safe Limit |
|---|---|---|---|---|---|---|---|---|
| Fan | No | Yes | No | Yes | No | Yes | No | — |
| Rectifier 1 Intake | 73 | 70 | 70 | 67 | 68 | 62 | 68 | 65 |
| Rectifier 2 Intake | 76 | 71 | 70 | 66 | 69 | 62 | 68 | 65 |
| Rectifier 3 Intake | 75 | 70 | 70 | 66 | 69 | 62 | 68 | 65 |
| Rectifier 1 Exit | 79 | 77 | 78 | 74 | 78 | 72 | 79 | — |
| Rectifier 2 Exit | 81 | 77 | 78 | 75 | 78 | 73 | 80 | — |
| Rectifier 3 Exit | 81 | 77 | 78 | 74 | 79 | 73 | 79 | — |

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or the second channel is positioned between a second portion of the outer wall and a second portion of said at least one of the multiple cabinet walls defining the interior enclosure space.

4. The electronics equipment cabinet of claim 3, wherein:
   the divider wall includes a first edge and a second edge opposite the first edge;

the first portion of the outer wall is adjacent the second portion of the outer wall;

the first portion of said at least one of the multiple cabinet walls defining the interior enclosure space is adjacent the second portion of said at least one of the multiple cabinet walls defining the interior enclosure space;

the first edge of the divider wall is positioned along an intersection of the first portion of the outer wall with the second portion of the outer wall; and the second edge of the divider wall is positioned along an intersection of the first portion of said at least one of the multiple cabinet walls defining the interior enclosure space with the second portion of said at least one of the multiple cabinet walls defining the interior enclosure space.

5. The electronics equipment cabinet of claim 1, wherein the divider wall is parallel to the outer wall and said at least one of the multiple cabinet walls defining the interior enclosure space.

6. The electronics equipment cabinet of claim 1, wherein:
the first channel is positioned between the outer wall and the first side of the divider wall; and
the second channel is positioned between the second side of the divider wall and said at least one of the multiple cabinet walls defining the interior enclosure space.

7. The electronics equipment cabinet of claim 1, wherein the divider wall extends in a vertical direction from a bottom of said at least one of the multiple cabinet walls defining the interior enclosure space to a top of said at least one of the multiple cabinet walls defining the interior enclosure space, and a height of the divider wall in said vertical direction is greater than a height in said vertical direction of said at least one of the multiple cabinet walls defining the interior enclosure space.

8. The electronics equipment cabinet of claim 1, further comprising a fan positioned in the second channel to selectively drive the external ambient air through the second channel.

9. The electronics equipment cabinet of claim 8, wherein the fan comprises an axial fan.

10. The electronics equipment cabinet of claim 8, wherein the fan comprises an impeller fan.

11. The electronics equipment cabinet of claim 1, wherein each of the external openings includes a grate having about an eighty percent open area to allow airflow through the grate.

12. The electronics equipment cabinet of claim 11, wherein each grate has about a ninety percent open area to allow airflow through the grate.

13. The electronics equipment cabinet of claim 1, wherein said at least one of the multiple cabinet walls defining the interior enclosure space comprises a top wall and a side wall of the cabinet, and the outer wall is coupled to the top wall and the side wall of the cabinet.

14. The electronics equipment cabinet of claim 1, further comprising one or more inclined plates positioned within the first channel and/or the second channel, each inclined plate including a first end and a second end, each inclined plate oriented at a non-parallel angle with respect to the outer wall to increase an airflow velocity of the external ambient air traveling through the second channel via the at least two external openings or an airflow velocity of the internal ambient air traveling through the first channel via the at least two internal openings.

* * * * *